(12) United States Patent
Teichmann et al.

(10) Patent No.: US 7,511,482 B2
(45) Date of Patent: Mar. 31, 2009

(54) INDUCTIVE PROXIMITY SWITCH

(75) Inventors: Reinhard Teichmann, Amtzell (DE); Bernd Buck, Nonnenhorn (DE); Joerg Schuetze, Wasserburg (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 11/468,874

(22) Filed: Aug. 31, 2006

(65) Prior Publication Data
US 2007/0200700 A1 Aug. 30, 2007

(30) Foreign Application Priority Data
Aug. 31, 2005 (DE) .................. 10 2005 041 456

(51) Int. Cl.
*G01B 7/14* (2006.01)
*H01F 5/00* (2006.01)

(52) U.S. Cl. .............................. 324/207.26; 324/207.17

(58) Field of Classification Search ............ 324/207.26, 324/326–329, 207.15, 207.18, 207.16, 207.17; 361/179, 180
See application file for complete search history.

(56) References Cited

U.S. PATENT DOCUMENTS

| | | | | |
|---|---|---|---|---|
| 3,659,194 | A | * | 4/1972 | Blackerby .................. 324/234 |
| 4,024,468 | A | * | 5/1977 | Hirschi ........................ 324/329 |
| 4,405,896 | A | * | 9/1983 | Akita .................... 324/207.18 |
| 4,553,040 | A | | 11/1985 | Trüper et al. |
| 4,879,531 | A | | 11/1989 | Tigges et al. |
| 4,893,076 | A | * | 1/1990 | Leonard et al. ........ 324/207.17 |
| 5,012,206 | A | | 4/1991 | Tigges et al. |
| 5,034,704 | A | * | 7/1991 | Tomioka et al. ............... 331/65 |
| 6,545,464 | B1 | | 4/2003 | Tigges et al. |
| 6,657,323 | B2 | | 12/2003 | Müller |

FOREIGN PATENT DOCUMENTS

| | | |
|---|---|---|
| DE | 3814131 C2 | 11/1989 |
| DE | 3840532 C2 | 8/1990 |
| DE | 3916916 A1 | 11/1990 |

(Continued)

OTHER PUBLICATIONS

Maryland Metrics, Hasberg CDR, Meas.Tool1, USA, 1999 Maryland Metrics, pp. 1-4.

(Continued)

*Primary Examiner*—Kenneth J Whittington
(74) *Attorney, Agent, or Firm*—David S. Safran; Roberts Mlotkowski Safran & Cole, P.C.

(57) ABSTRACT

An inductive proximity switch with a housing formed of a nonmagnetic, high-grade steel, with a transmitting coil, two receiving coils which are connected in series in opposite directions and which are located symmetrically relative to the transmitting coil, and an evaluation circuit which is connected to the receiving coils. At a given size, the inductive proximity switch has a relatively large operating distance and the operating distance is largely stable, especially is largely independent of temperature, essentially in that, on the back of the receiving coils, opposite the influence side, there is a pre-damping element and the pre-damping properties of the pre-damping element at least approximately correspond to the pre-damping properties of the housing on the influence side.

22 Claims, 6 Drawing Sheets

FOREIGN PATENT DOCUMENTS

| | | |
|---|---|---|
| DE | 4031252 C1 | 10/1991 |
| DE | 4021164 C1 | 11/1991 |
| DE | 4330140 C2 | 3/1995 |
| DE | 19740774 C2 | 3/1998 |
| JP | 407029466 * | 1/1995 |

OTHER PUBLICATIONS

Technical Informations, Hasberg-Precision Thickness Gauge Strip, Calibrated Shim, Foils, 2000/2001, Hasberg Schneider GMBH and Oct Internetdienst Christopher V. Der Osten, 9 pages.

* cited by examiner

INDUCTIVE PROXIMITY SWITCH

BACKGROUND OF THE INVENTION

1. Field of the Invention

The invention relates to an inductive proximity switch with an at least partially metal, preferably high-grade steel, especially preferably VA steel housing, especially with a housing which is formed at least partially of a nonmagnetic steel, with at least one transmitting coil, with two receiving coils which are connected in series in opposite directions and which are located symmetrically to the transmitting coil, and with an evaluation circuit which is connected to the receiving coils.

2. Description of Related Art

Inductive proximity switches, therefore electronic switching devices, are made without contacts and have been used for almost forty years largely in place of electrical, mechanically activated switching devices which are made with contacts, especially in electrical and electronic switching, measurement, and control circuits.

With inductive proximity switches it is indicated whether an electrically conductive, generally a metallic influence element, hereinafter always called a target, has approached the proximity switch far enough. If the target has approached the proximity switch far enough, an electronic switch which belongs to the inductive proximity switch is reversed; When the proximity switch is made as a make contact, the previously nonconductive electronic switch now becomes conductive, while in a proximity switch made as a break contact, the previously conductive electronic switch now blocks.

There are currently inductive proximity switches of various types. In the first type of inductive proximity switches, they include an oscillator. Then, it applies that part of the oscillator is a receiving coil or the oscillator with its "input" is connected to a receiving coil and that the oscillator is part of the evaluation circuit or the evaluation circuit is connected to the output of the oscillator. In inductive proximity switches of the first type, which include an oscillator, it applies to the oscillator, as long as the target has not yet reached a given distance to the inductive proximity switch, K×V=1 with K=feedback factor and V=magnification factor of the oscillator; i.e., the oscillator oscillates. When the target reaches a given distance, this generally leads to a reduction of the feedback factor K and magnification factor V so that K×V<1; i.e., the oscillations of the oscillator decay or the oscillator ceases to oscillate. Regardless of the state of the oscillator or the amplitude of the output voltage of the oscillator, an electronic circuit belonging to the evaluation circuit is controlled.

For the described inductive proximity switches of the first type, to detect the approach of a target, the so-called eddy current process is used in which the eddy current losses are evaluated which form when a target is moved into an alternating electromagnetic field which proceeds from the inductive proximity switch.

The eddy current process has the major disadvantage that the operating distance of the inductive proximity switch is dependent on the material of the target; if reference is made to the operating distance of an inductive proximity switch for a ferromagnetic target, the operating distance of the same inductive proximity switch for a non-ferromagnetic target is, for example, only roughly 50%. Relative to the operating distance which a certain inductive proximity switch has for a ferromagnetic target, therefore, a so-called correction factor must be used for a non-ferromagnetic target.

To have to use a correction factor in inductive proximity switches depending on the material of the target has been recognized to be a disadvantage for many years. Consequently, the technical field has already extensively addressed the problem of making an inductive proximity switch such that it has a correction factor of 1, i.e., so that a correction is not necessary (see German patent disclosure documents and patents 32 25 193 (U.S. Pat. No. 4,553,040); 37 14 433 (U.S. Pat. No. 4,879,531); 38 14 131; 38 40 532; 39 12 946 (U.S. Pat. No. 5,012,206); 39 16 916; 40 21 164; 40 31 252 (U.S. Pat. No. 5,264,733); 43 30 140; and 197 40 774.

In the second type of inductive proximity switches, an oscillator is not absolutely essential. In these inductive proximity switches, the influencing of a receiving coil which can be achieved by the target is evaluated differently by the evaluation circuit connected to the receiving coil. In this case, an alternating current is fed into the transmitting coil. Part of the resulting alternating electromagnetic field penetrates the receiving coil and induces in it a voltage which is dependent on the influence distance of the target. In the simplest case, a threshold switch is connected to the receiving coil as the input-side part of the evaluation circuit and responds to whether the voltage on the receiving coil is above or below a given threshold value; the voltage on the receiving coil is called the indicator voltage because the receiving coil is the actual indicator for whether the inductive proximity switch is significantly influenced by the target or not. Instead of a simple threshold switch, the evaluation circuit on the input side can also have an amplifier, a demodulator, a threshold switch and an additional switching amplifier.

Therefore, in inductive proximity switches of the latter described type, to detect the approach of a target, the above described eddy current process is not used. Instead, the so-called transformer process is used in which the target influences the magnetic coupling between the transmitting coil and the receiving coil, and thus, the magnitude of the voltage induced in the receiving coil.

In the inductive proximity switch which was initially described specifically and which, among others, is known from German patent disclosure documents 198 34 071 (U.S. Pat. No. 6,545,464) and 100 12 830 (U.S. Pat. No. 6,657,323), which therefore, in addition to the transmitting coil, has two receiving coils which are connected in series in opposite directions and which are located symmetrically relative to the transmitting coil. The transformer method is used in a special configuration, hereinafter called the transformer difference method. In this connection, in the two receiving coils, voltages are induced which have opposite polarity. The series connection of the two receiving coils then leads to the resulting voltage on the series connection of the two receiving coils being zero when the voltages induced in the two receiving coils are exactly the same in terms of amount and are exactly in opposing phase.

Inductive proximity switches of the type which underlie the invention and which are to be made and developed in accordance with the invention are now built such that, in the uninfluenced state, the resulting voltage on the series connection of the two receiving coils is not zero, but is very small, for example, 5 mV. For the uninfluenced state of the inductive proximity switch under consideration, a resulting voltage which differs from zero on the series connection of the two receiving coils is chosen because the deviation of the resulting voltage which occurs when the inductive proximity switch is influenced can be better detected and processed by the evaluation circuit when the initial value for the uninfluenced proximity switch is not equal to zero.

When a target approaches an inductive proximity switch of the above described type, in this way, the magnetic coupling between the transmitting coil, on the one hand, and the receiving coils, on the other hand, is asymmetrically influenced.

This results in the fact that, in the two receiving coils, voltages are induced which are no longer oppositely equal, so that, as a result, on the series connection of the two receiving coils, a voltage forms which deviates from the voltage which forms when the proximity switch is not influenced. If this voltage exceeds a given threshold value, the signal is evaluated as a "proximity switch influenced" signal.

In addition to the described problem of the necessity of a correction factor, for inductive proximity switches there are other criteria which can be important. For example, inductive proximity switches should often have a relatively large operating distance at a given overall size. The operating distance for which the inductive proximity switches are designed should be largely stable, especially should be independent of temperature as much as possible.

In various applications, for example, in the foodstuffs industry, so-called all-metal switches are required, i.e., inductive proximity switches which have a metal, preferably a high-grade steel housing, because permeation is or cannot be reliably enough prevented in a plastic housing.

SUMMARY OF THE INVENTION

It was stated initially that the invention relates to an inductive proximity switch with an at least partially metal housing. This means that the subject matter of the invention is both those inductive proximity switches with a housing which is formed only of metal on the influence side, which therefore have a metallic cover or metallic cap, while the housing otherwise consists of plastic, but that the subject matter of the invention is also those inductive proximity switches with a housing that is formed entirely of metal which are conventionally called all-metal switches.

Proceeding from the prior art described individually above, the primary object of the present invention is to embody and develop the initially described proximity switch such that the aforementioned criteria "correction factor 1 or almost 1", "relatively large switch distance at a given overall size", and "stability of the operating point, especially extensive independence of the operating point from temperature" are implemented.

The inductive proximity switch of the invention is, first of all, essentially characterized in that, on the back of the receiving coils, which is opposite the influence side, there is a pre-damping element and the pre-damping properties of the pre-damping element at least approximately correspond to the pre-damping properties of the housing on the influence side. This first measure in accordance with the invention leads to the fact that the inductive proximity switch of the invention, in the uninfluenced state, can be built relatively symmetrically, not only with respect to the magnetic coupling between the transmitting coil, on the one hand, and the receiving coils, on the other, that also the eddy current loss behavior can be realized identically or almost identically both on the influence side and on the back of the receiving coils which is opposite the influence side.

In particular, there are various possibilities for further embodying and developing the inductive proximity switch in accordance with the invention.

First of all, it is recommended that the same metal be used for the pre-damping element which is to be provided on the back of the receiving coils as for the metallic part of the housing or for the housing itself, preferably therefore high-grade steel, especially preferably VA steel. It is conventional to use VA steel 1.4404 overall for the metallic part of the housing, therefore, the metallic cover or the metallic cap, or for the housing, which then can also be used for the pre-damping element. However, there is also the possibility of implementing the pre-damping element—in one layer or several layers—from a calibrated shim foil, such as that manufactured by Hasberg-Schneider GmbH, 60 Rudolf-Stratz-Straβe 1, 83233 Bernau, Germany).

As stated, the pre-damping properties of the pre-damping element at least roughly correspond to the pre-damping properties of the housing on the influence side. This stipulation also influences the thickness of the pre-damping element. The pre-damping element can, accordingly, have a thickness from roughly 0.01 mm to 1.0 mm, preferably from roughly 0.03 mm to 0.7 mm, preferably from roughly 0.1 mm to 0.3 mm, for example.

One embodiment which is especially preferred with respect to implementation of the pre-damping element which is provided on the back of the receiving coils opposite the influence side is characterized in that the pre-damping element is made partially of the same material as the metallic part of the housing or the same material as the housing and partially of a calibrated shim foil. Thus, a temperature influence on the pre-damping element which results otherwise from the operation-induced heating of the inductive proximity switch is largely eliminated. Surprisingly, it has been shown that, for high-grade steel, the relative permeability factor and for a calibrated shim foil, the specific resistance change, depending on temperature, such that with corresponding dimensioning of the two parts of the pre-damping element the changing temperature is without effect as a result.

The inductive proximity switch in accordance with the invention includes only one transmitting coil as necessary for operation. One preferred embodiment is however characterized in that there are two transmitting coils which are connected in series in the same direction. In this way differences in the structure of the transmitting coil due to winding asymmetries can be reduced.

With reference to the three-dimensional and construction implementation of the transmitting coil or the transmitting coils and/or the receiving coils, there are preferred embodiments of the inductive proximity switch in accordance with the invention which will now be explained in detail.

First of all, it is recommended that the transmitting coil or transmitting coils be arranged concentrically with respect to the receiving coils. The receiving coils are preferably arranged coaxially in succession in the direction of influence. However, there is also the possibility of arranging the receiving coils concentrically relative to one another.

But basically, the transmitting coil or transmitting coils and/or the receiving coils can be made as so-called air-core reactors in the inductive proximity switch in accordance with the invention. However, to approach the target, at a given overall size to be able to implement a relatively great operating distance, it is recommended that the transmitting coil or transmitting coils and/or the receiving coils be located in a ferromagnetic pot-type core or in ferromagnetic pot-type cores. When the receiving coils are located in the ferromagnetic pot-type cores, of course, the pot-type cores must be located back to back, because they are "magnetically tight" on their backs.

In the inductive proximity switch in accordance with the invention, arranging the transmitting coils and/or the receiving coils in a ferromagnetic pot-type core has the advantage that, as a result, the three-dimensional tolerances are less than in the implementation with individual ferromagnetic pot-type cores. Consequently, an especially preferred embodiment of the inductive proximity switch in accordance with the invention is further characterized in that the transmitting coil or transmitting coils and the receiving coils are located on a single common pot-type core.

Another preferred embodiment of the inductive proximity switch in accordance with the invention is characterized in that the transmitting coil or the transmitting coils without a coil body is or are wound directly on the pot-type core or the pot-type cores and their length corresponds exactly to the length of the pot-type core or sum of the lengths of pot-type cores. In particular, in this embodiment, but also otherwise, it is recommended, when there are two ferromagnetic cores, that the pot-type cores be provided with their backs lying next to one another without spacing, preferably cemented to one another on their backs.

It is stated above that, in the transformer difference method used in the inductive proximity switch in accordance with the invention, provision must be made for the resulting voltage of the series connection of the two receiving coils to be theoretically zero in the uninfluenced state, however, in practice being not equal to zero, but being small, for example, 5 mV. This is achieved, in practice, in that in the uninfluenced state of the proximity switch, the resulting coupling factor between the transmitting coil and the transmitting coils and the two receiving coils connected in series is roughly 0.001 to 0.02. The symmetry or quasi-symmetry of the magnetic coupling between the transmitting coil and the transmitting coils and the receiving coils which is necessary for this purpose can also be implemented, in certain limits, in that, when there are two transmitting coils, the number of turns of the two transmitting coils per unit length differ slightly from one another and/or the number of turns of the two receiving coils per unit length differ slightly from one another.

Inductive proximity switches of the type under consideration and the inductive proximity switches in accordance with the invention are operated with transmitting frequencies which are conventionally between 10 kHz and 200 kHz. Surprisingly, it has been found that for different overall sizes, different transmitting frequencies are optimum. Preferably, the transmitting frequencies at size M 12 are between 100 kHz and 150 kHz, especially roughly 120 kHz, at size M 18 between 60 kHz and 100 kHz, especially roughly 80 kHz, and at size M 30 between 20 kHz and 30 kHz, especially roughly 25 kHz.

It has already been repeatedly stated that in the transformer difference method used in the inductive proximity switch in accordance with the invention provision must be made for the resulting voltage of the series connection of the two receiving coils to be theoretically zero in the uninfluenced state, in practice to have to be small, for example 5 mV. If the symmetry of the magnetic coupling between the transmitting coil or transmitting coils, on the one hand, and the receiving coils, on the other, which is necessary for this purpose cannot be implemented with sufficient precision, for compensation of the asymmetry of magnetic coupling between the transmitting coil or transmitting coils and the receiving coils, a trimming resistor can be assigned to the receiving coils.

In the inductive proximity switches in accordance with the invention, the evaluation of the indicator voltage which forms on the series connection of the two receiving coils can take place as is conventional, specifically by a threshold switch which represents the input of the evaluation circuit and which is located on the series connection of the two receiving coils; but on the input side the evaluation circuit can also be, as known in the prior art, an amplifier, then a demodulator, a threshold switch and an additional switching amplifier.

However, the teaching of the invention also includes special measures with reference to feed of the transmitting coil or transmitting coils and with reference to the evaluation of the indicator voltage which forms on the series connection of the receiving coils.

With reference to feed of the transmitting coil or transmitting coils, one preferred embodiment of the inductive proximity switch in accordance with the invention is characterized in that the transmitting coil or transmitting coils is or are part of a current balancing oscillator with preferably four oscillator transistors. This is a current balancing oscillator which is also used in inductive proximity switches which work according to the so-called eddy current method. This type of feed of the transmitting coil or transmitting coils results in that the change of the voltage on the receiving coils as a result of the influence by a target is accompanied by a change of the voltage on the transmitting coil or on the transmitting coils.

Other embodiments of the inductive proximity switch in accordance with the invention are characterized with respect to feed of the transmitting coil or the transmitting coils in that the transmitting coil or transmitting coils is or are fed either with a constant alternating current or with a constant AC voltage.

The various possibilities of feed of the transmitting coil or the transmitting coils are options for influencing and optimizing the operating distance for influencing with targets of varied material, such as iron, lead, copper, brass, high-grade steel, etc. Normally, it is the object to obtain a roughly identical operating distance for targets of different materials. In this connection, this operating distance should be largely independent of whether the target is a thin sheet or a foil or has a considerable thickness of, for example, 3 mm. A reduction in the size of the target should result in a loss of operating distance as small as possible.

With respect to the evaluation circuit of the inductive proximity switch in accordance with the invention, there is another teaching of the invention that the evaluation circuit on the input side contains a multiplier, on the one hand, the transmission voltage, therefore the voltage on the transmitting coil or on the transmitting coils, and on the other, the indicator voltage, therefore the voltage on the series connection of the receiving coils, is supplied to the multiplier and the product of the transmission voltage and the indicator voltage formed by the multiplier is evaluated in the evaluation circuit in magnitude and phase.

In particular, there are now various possibilities for embodying and developing the inductive proximity switch in accordance with the invention. These embodiments and developments will become apparent from the following description of preferred embodiments of an inductive proximity switch in accordance with the invention in conjunction with the drawings.

DETAILED DESCRIPTION OF THE INVENTION

The inductive proximity switch in accordance with the invention, which is shown in part only schematically in the figures, first of all, is comprised of a housing 1 which is made of a nonmagnetic steel, preferably of high-grade steel, specifically a VA steel, especially VA steel 1.4404, a transmitting coil 2, two receiving coils 3, 4 which are connected in series in opposite directions and which are located symmetrically with respect to the transmitting coil 1, and an evaluation circuit 5 connected to the receiving coils 3, 4.

Figure 1:
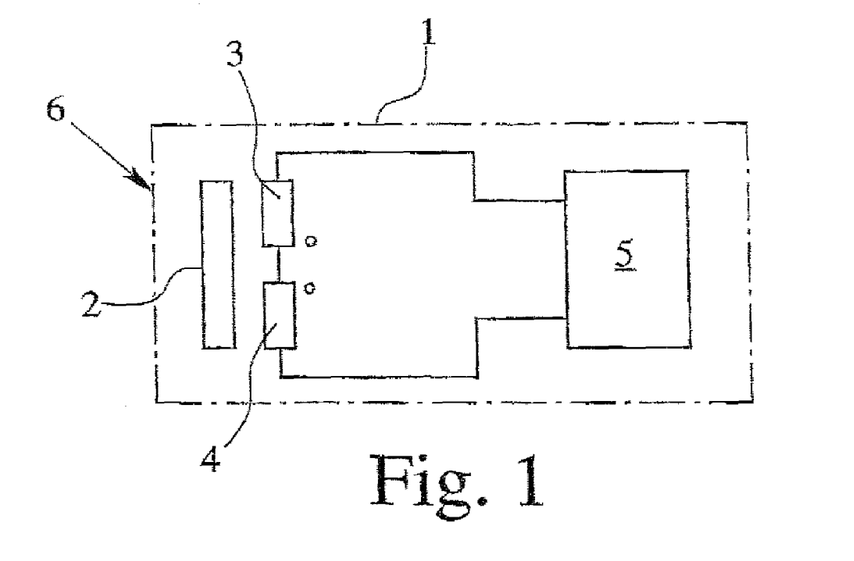
FIG. 1 is a schematic diagram of an inductive proximity switch in accordance with the invention.
Figure 2:
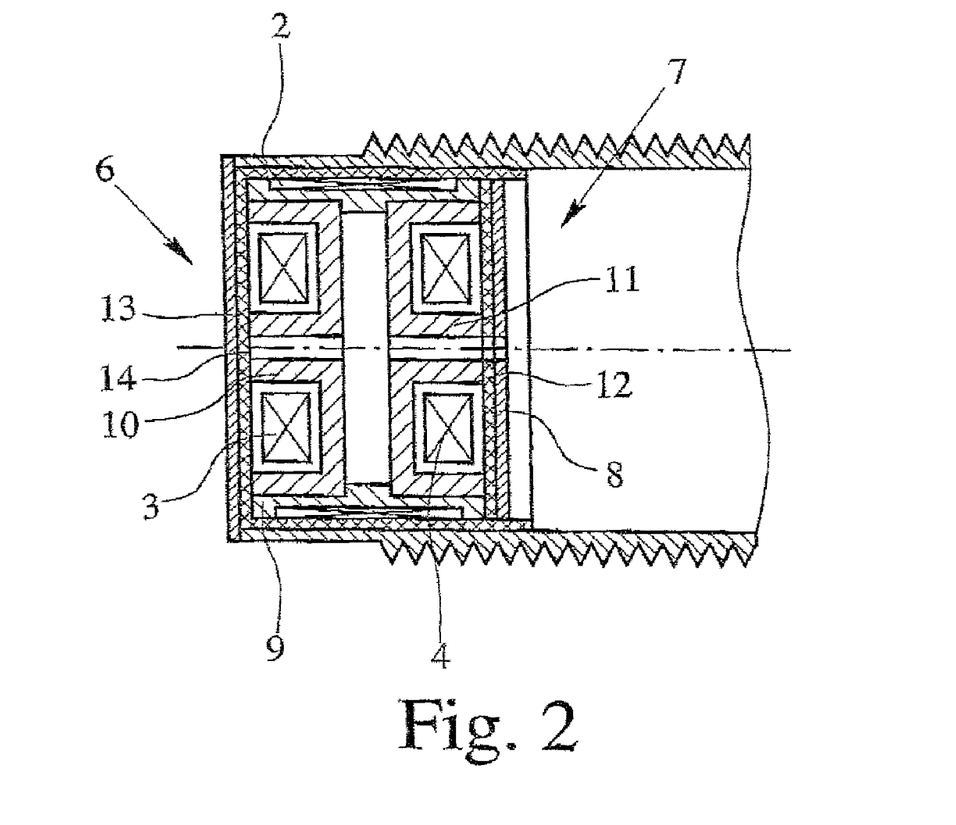
FIG. 2 shows a preferred first embodiment of the part of the inductive proximity switch in accordance with the invention which is important in accordance with the invention.
Figure 3:
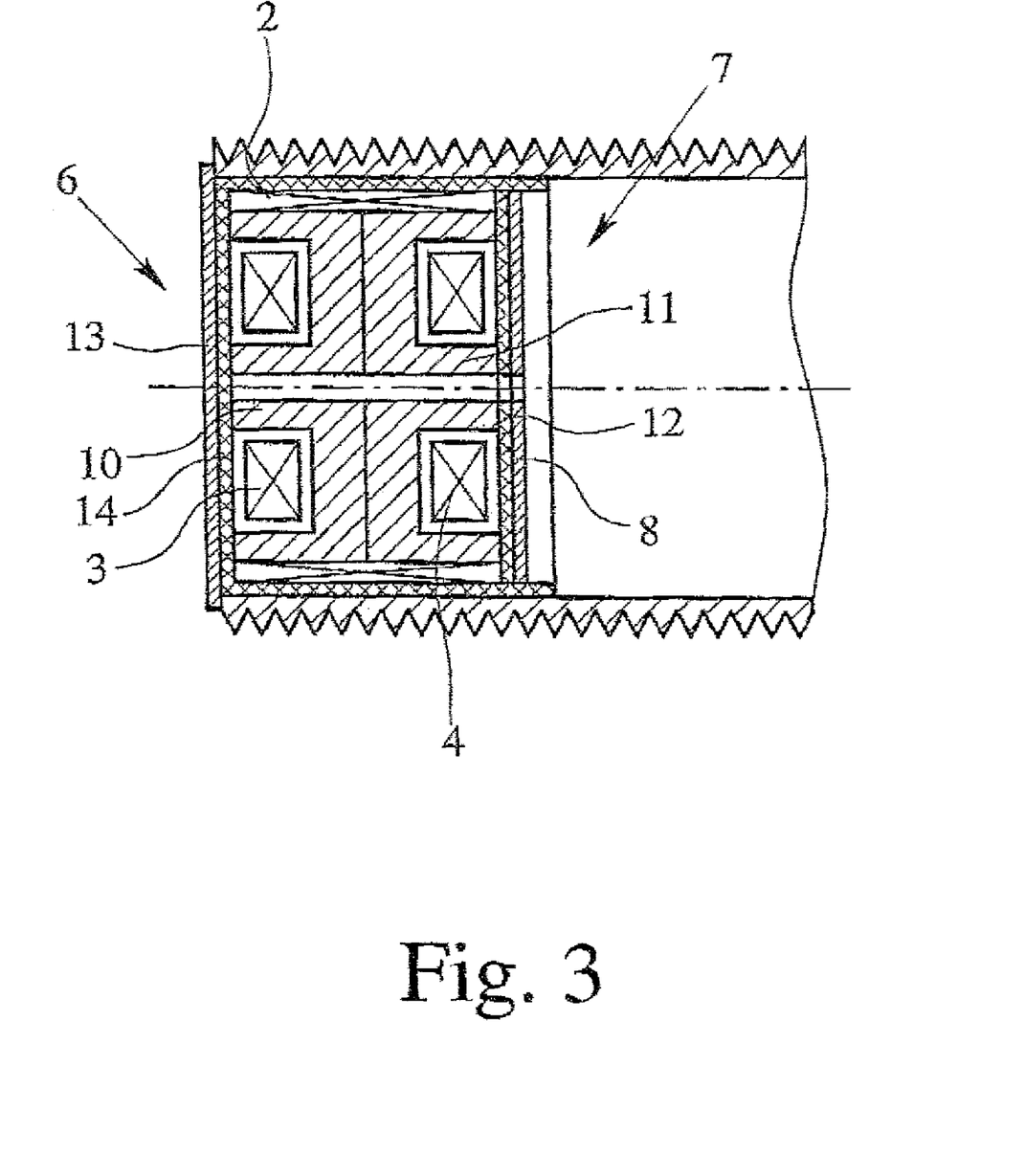
FIG. 3 shows a second preferred embodiment of the part of the inductive proximity switch in accordance with the invention which is important in accordance with the invention.
Figure 4:
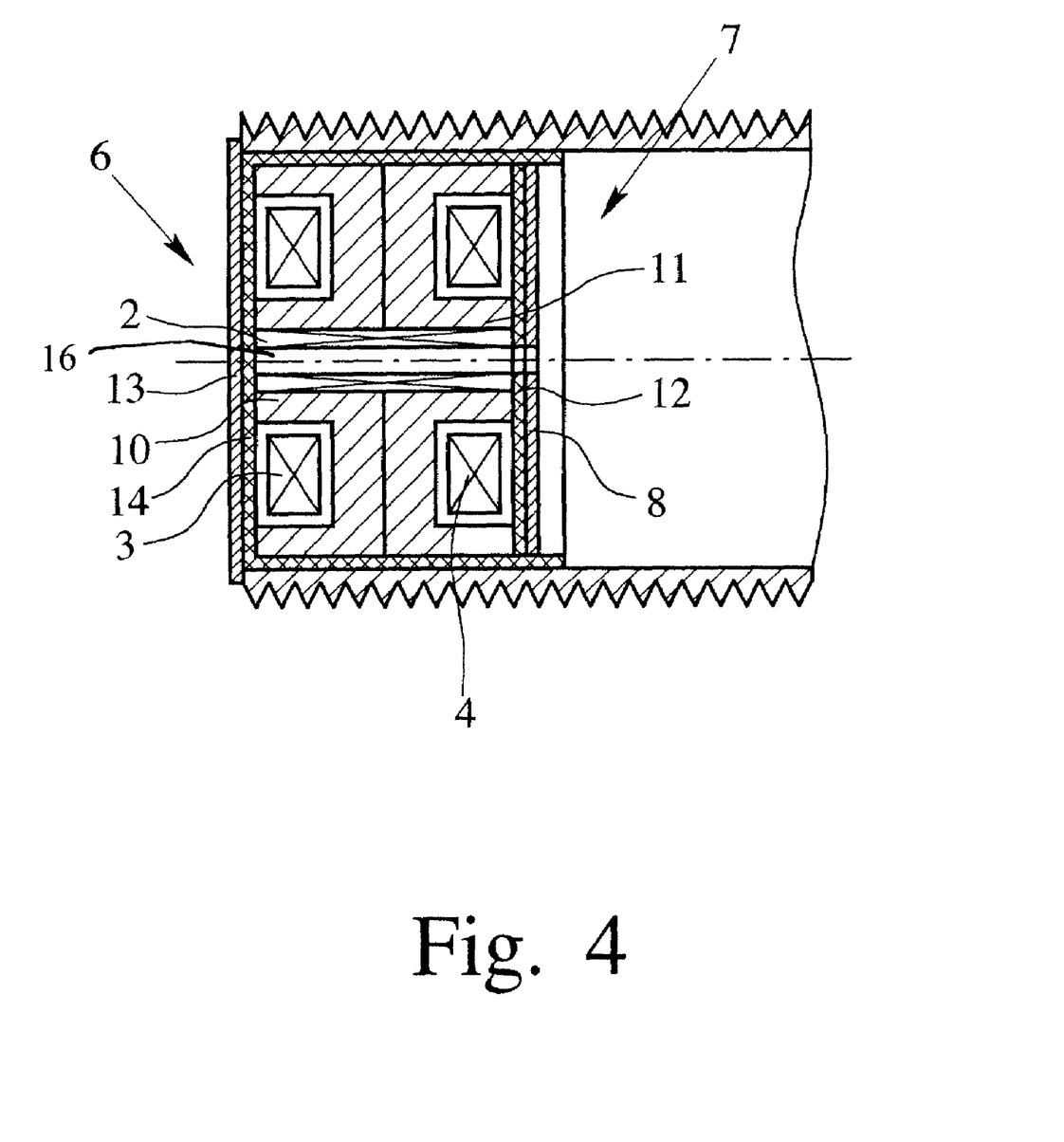
FIG. 4 shows a preferred third embodiment of the part of the inductive proximity switch in accordance with the invention which is important in accordance with the invention.

As can be taken from FIGS. 2, 3, and 4, for the inductive proximity switch in accordance with the invention, there is a pre-damping element 8 on the back 7 of the receiving coils 3, 4, which is opposite the influence side 6. The pre-damping properties of the pre-damping element 8 at least approximately correspond to the pre-damping properties of the housing 1 on the influence side 6; specifically the pre-damping element 8 is made of the same metal as the housing 1. Embodiments of the pre-damping element which are characterized in that the pre-damping element—in one layer or several layers—is formed of a Hasberg calibrated shim foil or that the pre-damping element is formed partially of the same metal as the housing 1 and partially of a Hasberg calibrated shim foil, are not shown.

Only one transmitting coil 2 is necessary for operation of the proximity switch in accordance with the invention; but there can also be two transmitting coils which can then be connected in series in the same direction instead of only one transmitting coil 2.

As shown by FIGS. 2 and 3, it applies to the embodiments of the inductive proximity switches in accordance with the invention which are shown here that the transmitting coil 2 is located concentrically relative to the receiving coils 3, 4, and that the receiving coils 3, 4 are located coaxially in succession in the influence direction; a concentric arrangement of the receiving coils relative to one another would also be possible.

Otherwise, FIG. 2 shows for the illustrated embodiment of an inductive proximity switch in accordance with the invention that the transmitting coil 2 and the receiving coils 3, 4 are located in ferromagnetic pot-type cores 9, 10, and 11, the transmitting coil 2 in the pot-type core 9, the receiving coil 3 in the pot-type core 10 and the receiving coil 4 in the pot-type core 11.

It applies to the embodiments of the inductive proximity switches in accordance with the invention which are shown in FIGS. 2, 3 and 4 that, between the pot-type core 11 and the pre-damping element 8, there is a spacer 12. Using the spacer 12, a defined distance between the pot-type core 11 and the pre-damping element 8 can be ensured.

On the influence side 6, the inductive proximity switches in accordance with the invention which are shown in FIGS. 2, 3 and 4 have a cover 13 which is formed preferably of a nonmagnetic, high-grade steel. Between the pot-type core 10 and the cover 13, which is part of the housing 1, there is a spacer 14 which makes it possible to easily maintain a defined distance between the pot-type core 10 and the cover 13. Preferably, the pre-damping element 8 is somewhat thicker than the cover 13 and the spacer 12 is also somewhat thicker than the spacer 14.

In the embodiment of an inductive proximity switch in accordance with the invention which is shown in FIG. 3, the transmitting coil 2 is wound directly onto the pot-type cores 10, 11; therefore, there is no special coil body. Otherwise, the length of the transmitting coil 2 corresponds exactly to the sum of the lengths of the pot-type cores 10, 11; therefore, the transmitting coil 12 ends on both sides flush with the pot-type cores 10 and 11.

One especially preferred embodiment of the inductive proximity switch in accordance with the invention is shown in FIG. 4 to the extent that, in this embodiment, the transmitting coil 2 is located in a cavity 15 which is provided concentrically in the pot-type cores 10, 11. In particular, the transmitting coil 2 is located on a rod-shaped ferrite core 16.

Otherwise FIGS. 3 & 4 show preferred embodiments of the inductive proximity switches in accordance with the invention to the extent that the pot-type cores 10, 11 adjoin one another back-to-back without a space, specifically are cemented together.

It is not shown that in the inductive proximity switch in accordance with the invention, when there are two transmitting coils, the two numbers of turns per unit length of the two transmitting coils can differ slightly from one another and the numbers of turns per unit length of the two receiving coils can differ slightly from one another. This measure within certain limits can implement the required symmetry of magnetic coupling between the transmitting coil or the transmitting coils, on the one hand, and the receiving coils, on the other.

Figure 5:
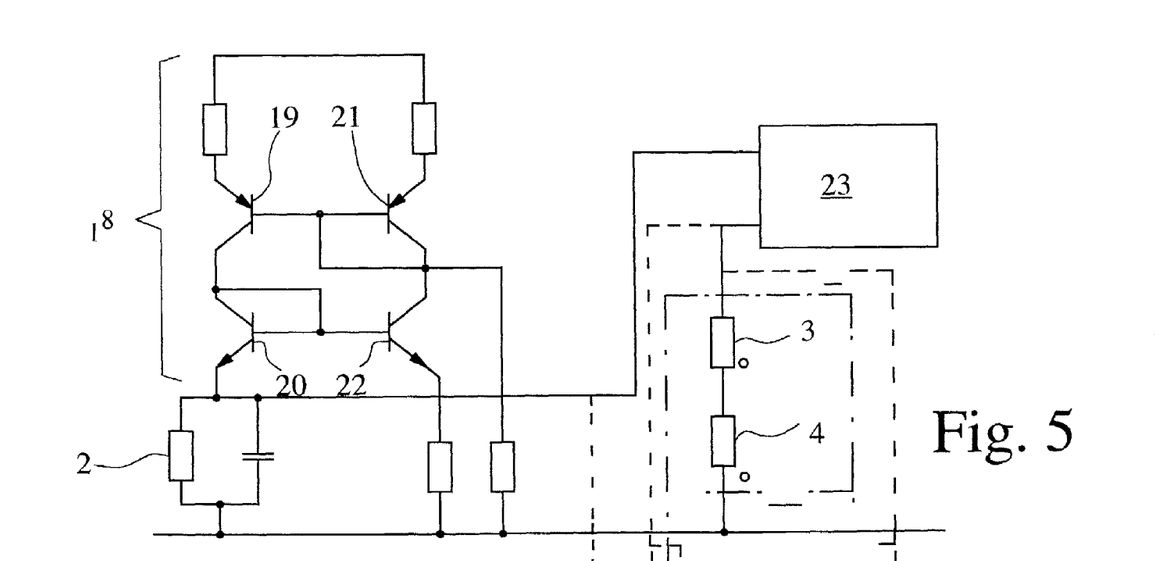
FIG. 5 is circuit diagram of a first preferred embodiment of an inductive proximity switch in accordance with the invention with alternative receiving coil arrangements shown in versions 5*a*, 5*b*.
Figure 5A:
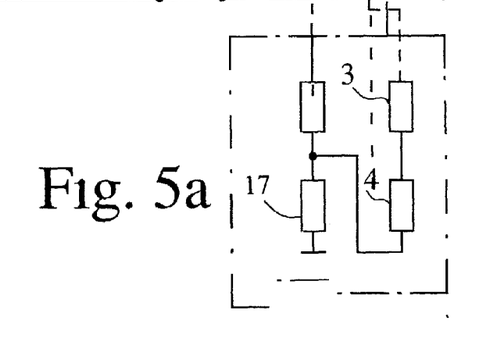
Figure 5B:
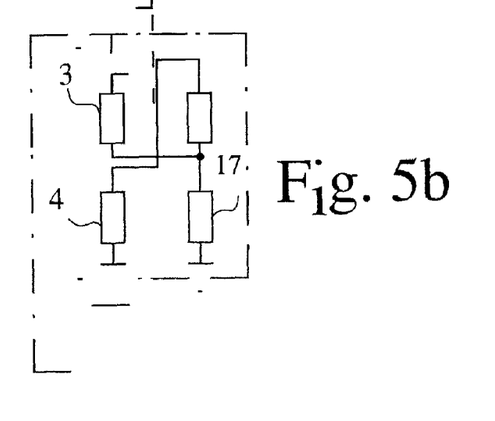
Figure 6:
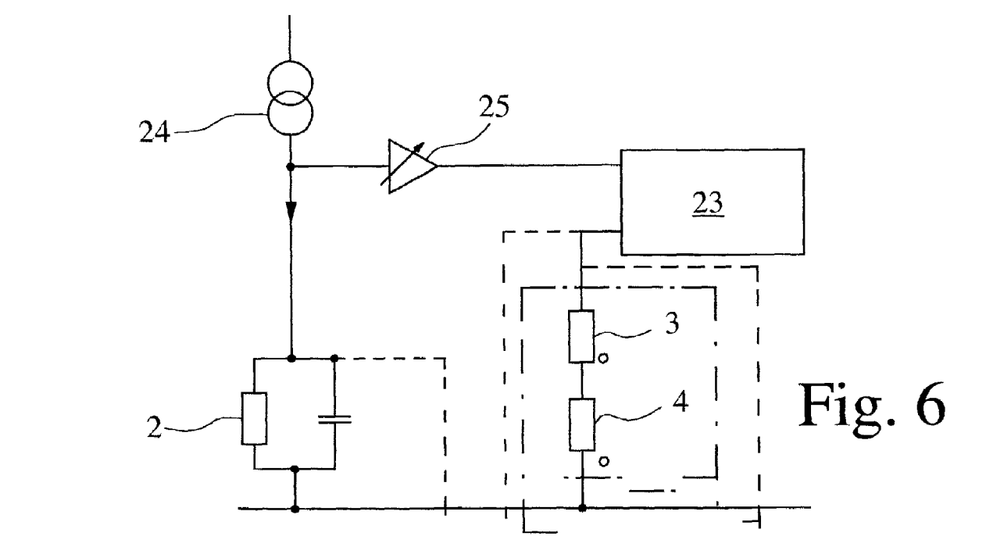
FIG. 6 is circuit diagram of a second preferred embodiment of an inductive proximity switch in accordance with the invention with alternative receiving coil arrangements shown in versions 6*a*, 6*b*.
Figure 6A:
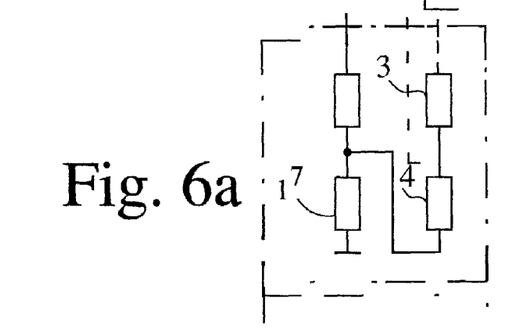
Figure 6B:
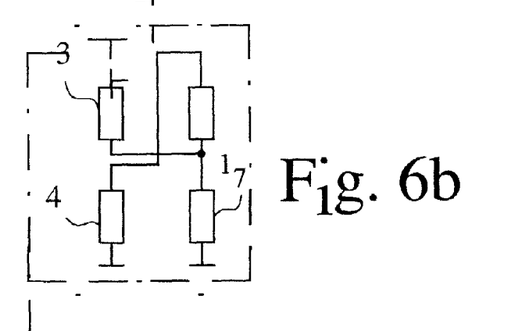
Figure 7:
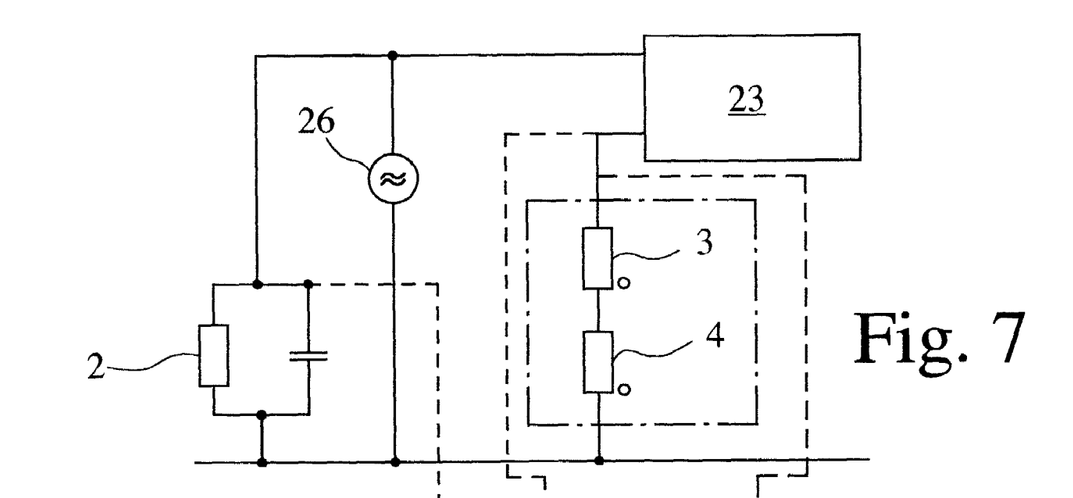
FIG. 7 is circuit diagram of a third preferred embodiment of an inductive proximity switch in accordance with the invention with alternative receiving coil arrangements shown in versions 7*a*, 7*b*.
Figure 7A:
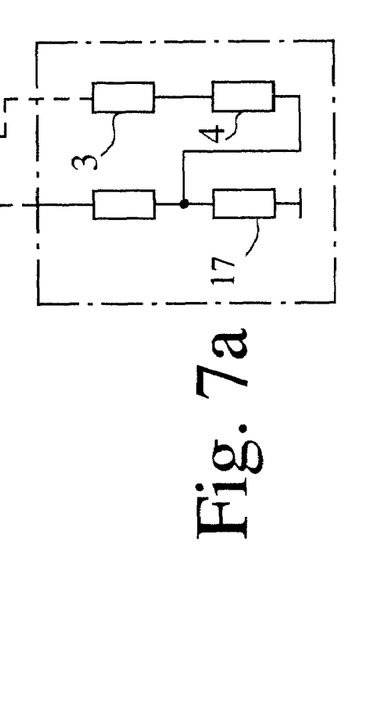
Figure 7B:
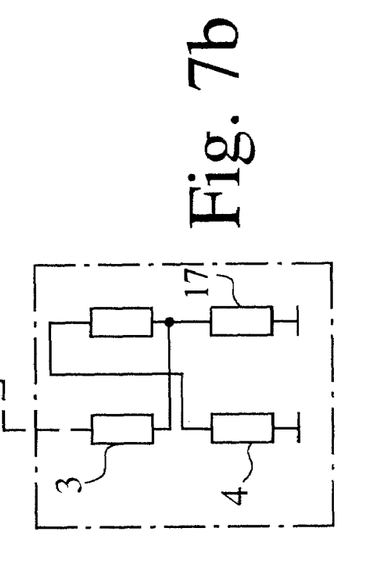

For the case in which, for the inductive proximity switch in accordance with the invention, the symmetry of magnetic coupling between the transmitting coil 2 and the receiving coils 3, 4 which is necessary for use of the transformer difference method cannot be implemented with sufficient precision, for compensation of the asymmetry of magnetic coupling between the transmitting coil 2 and the receiving coils 3, 4, a trimming resistor 17 can be assigned to the receiving coils 3, 4; possible implementations of this measure are shown in FIGS. 5, 6, and 7 with the dash line alternative versions in FIGS. 5*a* and 5*b*, 6*a* and 6*b*, and 7*a* and 7*b*.

The figures, especially FIGS. 5, 6, and 7, also show special measures with reference to the feed to the transmitting coil 2 and with reference to the evaluation of the indicator voltage formed on the series connection of the receiving coils 3, 4.

With reference to the feed to the transmitting coil 2, the embodiment of an inductive proximity switch in accordance with the invention which is shown in FIG. 5 is characterized in that the transmitting coil 2 is part of a current balancing oscillator 18 with four oscillator transistors 19, 20, 21, 22. This current balancing oscillator 18 is one which is also used in inductive proximity switches which work according to the so-called eddy current method. The feed of the transmitting coil 2 or the transmitting coils with the illustrated current balancing oscillator 18 results in that the change of the voltage on the receiving coils 3, 4, as a result of the influence by a target is also accompanied by a change of the voltage on the transmitting coil 2 or on the transmitting coils.

The embodiments of the inductive proximity switch in accordance with the invention which are shown in FIGS. 6 and 7 are characterized with respect to feed of the transmitting coil 2 in that the transmitting coil 2 is fed with a constant alternating current, FIG. 6, or with a constant AC voltage, FIG. 7.

With respect to the evaluation circuit 5 of the inductive proximity switch in accordance with the invention, FIG. 5 shows that the evaluation circuit 5, on the input side, contains a multiplier 23, to which, on the one hand, the transmission voltage, therefore the voltage on the transmitting coil 2, and on the other, the indicator voltage, therefore the voltage on the series connection of the receiving coils 3, 4, is supplied; the product of the transmission voltage and the indicator voltage formed by the multiplier 23 is evaluated in the evaluation circuit 5 in amount and phase.

In the embodiment as shown in FIG. 5 the voltage on the transmitting coil 2 is routed directly to the multiplier 23. In the embodiment as shown in FIG. 6, there is a constant current source 24 for feed of the transmitting coil 2 and the connection between the constant current source 24 and the transmitting coil 2 is connected to the multiplier 23 via a control amplifier 25. It applies again to the embodiment shown in FIG. 7, in which there is a constant current source 26, as in the embodiment shown in FIG. 6, that the voltage on the transmitting coil 2, which corresponds to the voltage of the constant voltage source 26, is connected directly to the multiplier 23.

What is claimed is:

1. Inductive proximity switch, comprising:
   an at least partially metal housing,
   at least one transmitting coil,
   two receiving coils which are connected in series in opposite directions and which are located symmetrically relative to the at least one transmitting coil, and
   an evaluation circuit which is connected to the receiving coils,
   wherein a pre-damping element is provided on a back of the receiving coils which is opposite an influence side of the receiving coils, and wherein the pre-damping element has pre-damping properties that at least approximately correspond to pre-damping properties of the housing on the influence side,
   wherein the receiving coils are located in ferromagnetic pot-shaped cores,
   wherein the ferromagnetic pot-shaped cores are arranged back-to-back, and
   wherein the at least one transmitting coil, without a coil body, is wound directly onto the pot-shaped cores and has a length that corresponds exactly to the sum of the lengths of the pot-shaped cores.

2. Inductive proximity switch as claimed in claim 1, wherein the housing is formed of high-grade steel at least on the influence side.

3. Inductive proximity switch as claimed in claim 1, wherein the pre-damping element is made of the same metal as the housing.

4. Inductive proximity switch as claimed in claim 1, wherein the pre-damping element is formed by part of the housing.

5. Inductive proximity switch as claimed in claim 1, wherein the pre-damping element has a thickness of about 0.01 mm to 1.0 mm.

6. Inductive proximity switch as claimed in claim 1, wherein the pre-damping element has a thickness of about 0.1 mm to 0.3 mm.

7. Inductive proximity switch as claimed in claim 1, wherein the pre-damping element is a calibrated shim foil.

8. Inductive proximity switch as claimed in claim 1, wherein the pre-damping element is formed partially of the same metal as the housing and partially of a calibrated shim foil.

9. Inductive proximity switch as claimed in claim 1, wherein the at least one transmitting coil comprises two transmitting coils connected in series in the same direction.

10. Inductive proximity switch as claimed in claim 9, wherein the two transmitting coils numbers have a number of turns per unit length that differs slightly from one another.

11. Inductive proximity switch as claimed in claim 1, wherein the at least one transmitting coil is arranged concentrically relative to the receiving coils.

12. Inductive proximity switch as claimed in claim 1, wherein the receiving coils are arranged coaxially in succession in an influence direction.

13. Inductive proximity switch as claimed in claim 1, wherein the receiving coils are arranged concentrically to one another.

14. Inductive proximity switch as claimed in claim 1, wherein at least one of the at least one transmitting coil and the receiving coils is located in a respective ferromagnetic pot-shaped core.

15. Inductive proximity switch as claimed in claim 1, the ferromagnetic pot-shaped cores arranged back-to-back are cemented together.

16. Inductive proximity switch as claimed in claim 1, wherein the two receiving coils have a number of turns per unit length that differs slightly from one another.

17. Inductive proximity switch as claimed in claim 1, wherein the transmitting frequency of the at least one transmitting coil between one of 100 kHz and 150 kHz at size M 12, 60 kHz and 100 kHz at size M 18, and 20 kHz and 30 kHz at size M 30.

18. Inductive proximity switch as claimed in claim 1, wherein an adjustable trimming resistor is assigned to the receiving coils for compensation of asymmetry of magnetic coupling between the at least one transmitting coil and the receiving coils.

19. Inductive proximity switch as claimed in claims 1, further comprising a current balancing oscillator with a feed for the at least one transmitting coil.

20. Inductive proximity switch as claimed in claim 1, further comprising a constant alternating current feed for the at least one transmitting coil.

21. Inductive proximity switch as claimed in claim 1, further comprising a constant alternating voltage feed for the at least one transmitting coil.

22. Inductive proximity switch as claimed in claim 1, further comprising an evaluation circuit having a multiplier on an input side, wherein the multiplier is connected to receive the voltage on the transmitting coil and the voltage on the series connection of the receiving coils, and wherein the evaluation circuit is adapted to evaluate the magnitude and phase of the output product of the multiplier.

* * * * *